(12) United States Patent
Valiente

(10) Patent No.: US 7,215,690 B2
(45) Date of Patent: May 8, 2007

(54) LASER MODULE

(75) Inventor: Miguel Galan Valiente, Barcelona (ES)

(73) Assignee: Monocrom, S.L., Barcelona (ES)

( * ) Notice: Subject to any disclaimer, the term of this patent is extended or adjusted under 35 U.S.C. 154(b) by 208 days.

(21) Appl. No.: 10/910,849

(22) Filed: Aug. 4, 2004

(65) Prior Publication Data

US 2006/0029117 A1 Feb. 9, 2006

(51) Int. Cl.
*H01S 3/04* (2006.01)

(52) U.S. Cl. .......................... 372/36; 372/75

(58) Field of Classification Search .............. 372/35, 372/36, 87, 32, 38.1
See application file for complete search history.

(56) References Cited

U.S. PATENT DOCUMENTS

| | | | | |
|---|---|---|---|---|
| 6,198,758 B1 * | 3/2001 | Broderick et al. | ............ | 372/36 |
| 6,643,302 B1 * | 11/2003 | Nishikawa et al. | ........... | 372/35 |
| 6,983,001 B2 * | 1/2006 | Sukhman et al. | ............. | 372/34 |
| 7,050,475 B2 * | 5/2006 | Monty | ......................... | 372/87 |
| 2006/0007966 A1 * | 1/2006 | Laughman et al. | ........... | 372/12 |

* cited by examiner

*Primary Examiner*—Minsun Oh Harvey
*Assistant Examiner*—Tuan N. Nguyen
(74) *Attorney, Agent, or Firm*—Wolf, Block, Schorr & Solis-Cohen LLP; William H. Dippert

(57) ABSTRACT

A solder-free laser module which comprises at least one laser chip clamp-mounting between electrodes. The laser module includes: some electrodes facing each other and having opposite poles; insulating separators placed between the facing surfaces of the electrodes to prevent direct contact between them and their short-circuiting; laser chips mounted between the facing surfaces of said electrodes, making contact with the electrodes, and clamping means for bringing the electrodes facing each other more closely together to ensure their contact with the laser chips positioned between them, thereby ensuring electrical power supply to the aforesaid laser chips and dissipation of the heat generated. The invention further relates to a method for assembling the aforesaid laser module.

18 Claims, 1 Drawing Sheet

LASER MODULE

FIELD OF THE INVENTION

Figure 1:
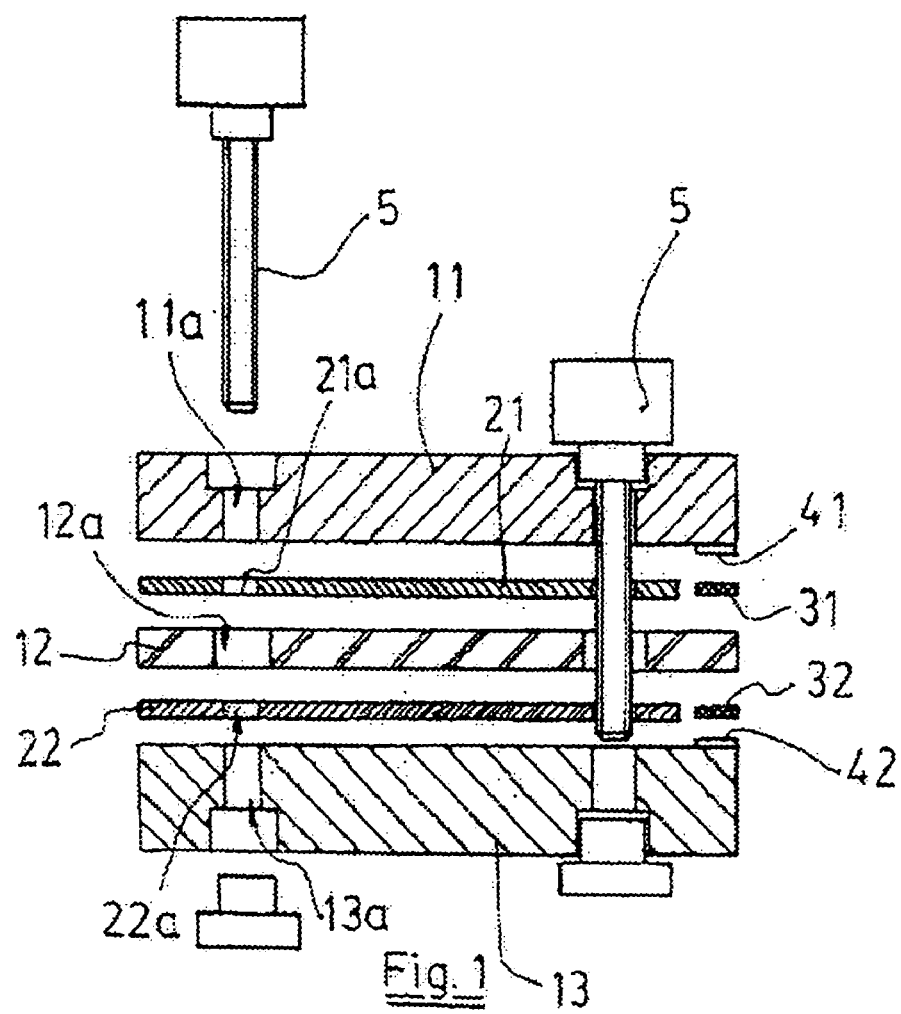

This invention relates to a laser module, of the type that has laser chips connected electrically to electrodes. This invention further relates to a method for assembling the aforesaid laser module.

BACKGROUND OF THE INVENTION

In the laser modules currently known in the art, the laser chips are mounted on at least one of the electrodes by soldering, which causes various problems.

The main problem caused is that the laser chip must be placed with very high precision, in such a way that its end projects from the end of the electrode, so that the soldered connection which will join it to said electrode does not reach laser chip emission zone, for if it does so the laser module will be defective.

At present, in order to position the laser chip correctly in relation to the electrodes and their soldered connection with acceptable precision it is necessary to have available micro-robots and other high-precision appliances, which calls for a very considerable investment and thus has a marked effect on the end price of the product.

The soldered connection of the laser chip does not permit subsequent adjustment of its position or replacement of the chip in the event of failure. At present, if the chips have been positioned incorrectly or if they have failed the entire laser module has to be replaced, with the consequent losses.

Another problem currently encountered arises due to the different expansion coefficients of the laser chip material and of the electrode material. This difference results in the possibility of alterations in the laser chip, usually in its refractive index.

Some normal problems related to the difference in the expansion coefficients are the residual mechanical stress resulting from the soldering process, and also the mechanical stress induced when the laser is pulsed during operation, being both problems due to thermal expansion mismatch between the soldered materials. The residual mechanical stress causes a lifetime reduction of the laser chip. The residual mechanical stress also causes some curvature in the laser chip, called "smile" and this affects negatively to the beam shaping of the laser module.

In order to reduce the difference in the expansion coefficients and their aforesaid problems, special materials for the electrodes are used, for example copper alloys with tungsten, but such alloys present bad thermal conductivity and therefore the corresponding laser modules have bad thermal parameters.

Other general problem of the soldering process is the high temperature reached during this process, which results in the creation of defects in the laser structure.

SUMMARY OF THE INVENTION

The laser module of the invention has been designed to solve the aforesaid problems, in that it has constructional features directed at providing solder-free assembly, ensuring correct parallelism and functionality of the laser chips that make it up and a reduction of manufacturing costs due to it not requiring the use of micro-robots for making soldered connections.

The laser module of the invention is of the type which has one or more laser chips connected electrically to electrodes.

In accordance with the invention, the laser module comprises: some electrodes facing each other and having opposite electrical poles; insulating separators placed between the facing surfaces of the electrodes to prevent direct contact between them and their short-circuiting; laser chips mounted between the facing surfaces of said electrodes, making contact with the electrodes, and clamping means for bringing the electrodes facing each other more closely together to ensure their contact with the laser chips positioned between them, thereby ensuring electrical power supply to the aforesaid laser chips and dissipation of the heat generated.

Therefore, the mechanical securing of the laser chips by means of the pressure exerted upon them by the electrodes using the aforesaid clamping means allows the soldered connections to be eliminated, while at the same time providing correct attachment and electrical connection of the laser chips.

Advantageously, the insulating separators leave between the electrodes a free end zone of sufficient size for fitting of the laser chips in contact with the aforesaid electrodes.

Provision is also made for the insulating separators to be of a thickness greater than that of the laser chips and to have the necessary elasticity to permit their compression under the thrust provided by the clamping means, in order to ensure contact of the electrodes with the laser chips, which on the one hand permits mechanical securing of the chips by the electrodes and on the other hand electrical and thermal contact between the electrodes and the laser chips.

Optionally, the insulating separators are of a thickness similar to that of the laser chip and are made of a material of high thermal conductivity.

According to one embodiment of the invention, the electrodes are made of a material which itself dissipates the heat generated by the laser module, being the dissipation of the heat generated of passive type.

According to another embodiment of the invention, at least one of the electrodes are provided with internal conduits for the circulation of a cooling fluid, being the dissipation of the heat generated of active type.

Optionally, the electrodes, at the supporting zone of the laser chips, have interfacing means such as a layer, coating, film or surface treatment of a material of high electrical and thermal conductivity, in order to ensure effective electrical contact between the electrodes and the chips, as well as dissipation of the heat generated.

Preferably, the interfacing means are made of a material of high flexibility.

Optionally, the interfacing means comprise carbon nanotubes located between the electrodes and the laser chips. The carbon nanotubes are know to have superior thermal and electrical properties. In addition, the nanotubes are extremely flexible, which permits the total adaptation between the electrodes and the chips.

According to one embodiment of the invention, the clamping means for fixing the various parts of the laser module comprise at least one screw mounted in some through-holes which run through the electrodes and the insulating separators.

According to another embodiment of the invention, the clamping means for fixing the various parts of the laser module comprise elastic means which bear upon the exterior surface of the end electrodes of the laser module.

According to another embodiment of the invention, the clamping means for fixing the various parts of the laser module comprise wedging means which bear upon the exterior surface of the end electrodes of the laser module.

Optionally, at least one of the end electrodes, at the supporting zone of the laser chips, comprises a projection which has a similar surface to that of the laser chip. Thereby, this projection ensure suitable contact between the electrodes and the laser chips in case of sagging of the end electrodes due to the action of the clamping means.

The method for assembling the laser module of the invention, comprising the steps of:

mounting some electrodes facing each other;

connecting the electrodes in alternating order with opposite poles;

mounting some insulating separators placed between the facing surfaces of the electrodes to prevent direct contact between them and their short-circuiting;

mounting some laser chips between the facing surfaces of said electrodes, making contact with the electrodes; and, mounting some clamping means for bringing the electrodes facing each other more closely together to ensure their contact with the laser chips positioned between them, thereby ensuring electrical power supply to the aforesaid laser chips and dissipation of the heat generated.

Advantageously, said step of mounting the insulating separators comprises the subsidiary step of leaving between the electrodes a free end zone of sufficient size for fitting of the laser chips in contact with the aforesaid electrodes.

Preferably, said step of mounting the laser chips between the facing surfaces of said electrodes is performed at room temperature.

Optionally, further comprising the step of providing at least one of the electrodes with internal conduits for the circulation of a cooling fluid.

Preferably, further comprising the step of providing the electrodes, at the supporting zone of the laser chips, with some interfacing means of a material of high electrical and thermal conductivity.

This laser module presents significant manufacturing advantages over those previously known, the most notable advantages being:

elimination of the soldered connections and the need to use high-temperature soldering processes, and therefore the aforesaid problems related to this;

elimination of the problems caused by the use of materials with different expansion coefficients since the clamp-mounting process is performed at low temperature, preferably at room-temperature; which results in a longer life and a reduction in the beam shaping degradation of the laser chip;

the clamp-mounting process of the laser module is reversible;

the possibility of fitting the laser chips without their projecting from the outline of the electrodes, so that they are better protected; and, the possibility of correcting the position of the laser chips included in the module, or even replacing them.

BRIEF DESCRIPTION OF THE INVENTION

Figure 2:
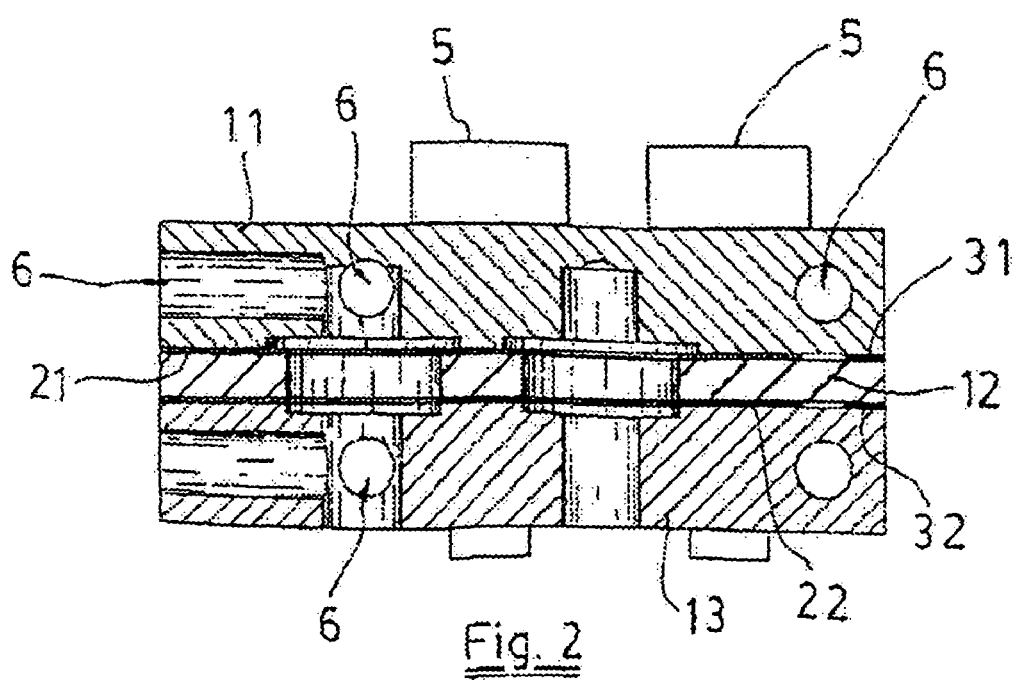

In order to complement this description and facilitate an understanding of the characteristics of the invention, this specification is accompanied by a set of drawings which, with illustrative and non-restrictive character, show the following:

FIG. 1 is a side view of an example of embodiment of the laser module, sectioned along a vertical plane, in which the parts making it up have been shown schematically and disassembled; and FIG. 2 is a side view of an example of embodiment of the assembled laser module sectioned along a vertical plane. In this case the electrodes have interior channels for the circulation of a cooling fluid.

DETAILED DESCRIPTION OF THE PREFERRED EMBODIMENT

In the example of embodiment shown in the figures described, the laser module has some electrodes (11, 12 and 13) superimposed and made of copper or a copper alloy of high thermal and electrical conductivity. The electrodes are connected serially, being the two end electrodes (11, 13) connected to different electrical poles, while the electrode (12) placed between the former two is floating.

Between the electrodes (11, 12 and 13) are some insulating separators (21, 22) whose surface area is slightly smaller than that of the electrodes (11, 12 and 13), and two laser chips (31, 32) which are placed between the facing sides of the aforesaid electrodes, more specifically coinciding with the end zones thereof not reached by the insulating separators (21, 22), thus ensuring contact of each one of the chips (31, 32) with two electrodes (11, 12) and (12, 13) of different polarity.

As FIG. 1 shows, the electrodes (11, 13) can have in the zone of contact with the laser chips (31, 32) a layer, coating, film or surface treatment (41, 42) of material of high electrical and thermal conductivity. The layers (41, 42) car be composed, for example, at a combination of gold and carbon nanotubes, since gold protects the copper electrodes against oxidation and carbon nanotubes has high electrical and thermal conductivity, which facilitates dissipation of the heat produced. Moreover, carbon nanotubes are highly flexible and therefore can be adapted to the imperfections and inhomogeneities of both the electrodes and the laser chips.

Fixing of the insulating separators (21, 22) and of the laser chips (31, 32) between the electrodes (11, 12 and 13) is implemented by clamping means composed of one or more screws (5).

The screw or screws (5) are mounted in some orifices (11a, 12a and 13a) provided in the electrodes (11, 12 and 13).

In order to prevent the screws (5) making contact in the assembled position with the electrode (12) which occupies the intermediate position, provision has been made for the latter to have through-orifices (12a) whose diameter is larger than that of the aforesaid screws (5).

The insulating separators (21, 22) will be made of an elastic material, preferably silicone, and also have orifices (21a, 22a) for passage of the screws (5).

The insulating separators (21, 22) are of a thickness greater than that of the laser chips (31, 32) which means that they can be compressed when the screws (5) are tightened in order to ensure contact of the electrodes (11, 12) and (12, 13) with the laser chips (31, 32) placed between the latter.

As FIG. 2 shows, the electrodes (11, 12 and 13) can have internal conduits (6) for the circulation of a cooling fluid such as water.

The nature of the invention having been sufficiently described, together with an example of preferred embodiment, it is set on record for the appropriate purposes that the materials, shape, size and arrangement of the elements described may be modified, as long as this does not involve alteration of the essential characteristics of the invention which are claimed below.

The invention claimed is:

1. A laser module, of the type that has at least one laser chip connected electrically to electrodes, wherein it includes: some electrodes (11, 12 and 13) facing each other and having opposite poles; insulating separators (21, 22) placed between the facing surfaces of the electrodes (11, 12 and 13) to prevent direct contact between them and their short-circuiting; laser chips (31, 32) mounted between the facing surfaces of said electrodes (11, 12 and 13), making contact with the electrodes, and clamping means (5) for bringing the electrodes (11, 12 and 13) facing each other more closely together to ensure their contact with the laser chips (31, 32) positioned between them, thereby ensuring electrical power supply to the aforesaid laser chips and dissipation of the heat generated.

2. The laser module, according to claim 1, wherein the insulating separators (21, 22) leave between the electrodes (11, 12 and 13) a free end zone of sufficient size for fitting of the laser chips (31, 32) in contact with the aforesaid electrodes (11, 12 and 13).

3. The laser module, according to claim 1, wherein the insulating separators (21, 22) are of a thickness greater than that of the laser chips (31, 32) and are made of a material of the necessary elasticity to permit their compression down to ensure contact of the electrodes (11, 12 and 13) with the laser chips (31, 32).

4. The laser module, according to claim 1, wherein the insulating separators (21, 22) are of a thickness similar to that of the laser chip (31, 32) and are made of a material of high thermal conductivity.

5. The laser module, according to claim 1, wherein the electrodes (11, 12 and 13) are made of a material which itself dissipates the heat generated by the laser module.

6. The laser module, according to claim 1, wherein at least one of the electrodes (11, 12, 13) are provided with internal conduits (6) for the circulation of a cooling fluid.

7. The laser module, according to claim 1, wherein the electrodes (11, 12 and 13), at the supporting zone of the laser chips (31, 32 have interfacing means 41, 42) of a material of high electrical and thermal conductivity.

8. The laser module, according to claim 7, wherein the interfacing means (41, 42) are made of a material of high flexibility.

9. The laser module, according to claim 7, wherein the interfacing means (41, 42) comprise carbon nanotubes located between the electrodes (11, 12 and 13) and the laser chips (31, 32).

10. The laser module, according to claim 1, wherein the clamping means for fixing the various parts of the laser module comprise at least one screw (5) mounted in some through-orifices (11a, 12a, 13a, 21a, 22a) which run through the electrodes and the insulating separators.

11. The laser module, according to claim 1, wherein the clamping means for fixing the various parts of the laser module comprise elastic means which bear upon the exterior surface of the end electrodes (11, 13).

12. The laser module, according to claim 1, wherein the clamping means for fixing the various parts of the laser module comprise wedging means which bear upon the exterior surface of the end electrodes (11, 13).

13. The laser module, according to claim 1, wherein at least one of the end electrodes (11, 13), at the supporting zone of the laser chips (31, 32), comprises a projection which has a similar surface to that of the laser chip.

14. A method for assembling a laser module, comprising the steps of:

mounting some electrodes (11, 12 and 13) facing each other;

connecting the electrodes (11, 12 and 13) in alternating order with opposite poles;

mounting some insulating separators (21, 22) placed between the facing surfaces of the electrodes (11, 12 and 13) to prevent direct contact between them and their short-circuiting;

mounting some laser chips (31, 32) between the facing surfaces of said electrodes (11, 12 and 13), making contact with the electrodes; and, mounting some clamping means for bringing the electrodes (11, 12 and 13) facing each other more closely together to ensure their contact with the laser chips (31, 32) positioned between them, thereby ensuring electrical power supply to the aforesaid laser chips and dissipation of the heat generated.

15. The method, according to claim 14, wherein said step of mounting the insulating separators (21, 22) comprises the subsidiary step of leaving between the electrodes (11, 12 and 13) a free end zone of sufficient size for fitting of the laser chips (31, 32) in contact with the aforesaid electrodes (11, 12 and 13).

16. The method, according to claim 14, wherein said step of mounting the laser chips (31, 32) between the facing surfaces of said electrodes (11, 12 and 13) is performed at room temperature.

17. The method, according to claim 14, wherein further comprising the step of providing at least one of the electrodes (11, 12, 13) with internal conduits (6) for the circulation of a cooling fluid.

18. The method, according to claim 14, wherein further comprising the step of providing the electrodes (11, 12 and 13), at the supporting zone of the laser chips (31, 32), with some interfacing means (41, 42) of a material of high electrical and thermal conductivity.

* * * * *